United States Patent
Böttcher

(10) Patent No.: US 7,315,167 B2
(45) Date of Patent: Jan. 1, 2008

(54) VOLUME COIL FOR A MAGNETIC RESONANCE TOMOGRAPHY APPARATUS

(75) Inventor: Uwe Böttcher, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/594,636

(22) Filed: Nov. 8, 2006

(65) Prior Publication Data

US 2007/0103153 A1 May 10, 2007

(30) Foreign Application Priority Data

Nov. 8, 2005 (DE) ...................... 10 2005 053 280

(51) Int. Cl.
*G01V 3/00* (2006.01)
(52) U.S. Cl. ....................... 324/318; 324/322
(58) Field of Classification Search ........ 324/300–322; 600/407–456
See application file for complete search history.

(56) References Cited

U.S. PATENT DOCUMENTS

| 4,897,604 A | | 1/1990 | Carlson et al. |
| 5,606,259 A | | 2/1997 | Potthast et al. |
| 5,850,143 A | * | 12/1998 | Schubert et al. ............ 324/318 |
| 6,626,902 B1 | * | 9/2003 | Kucharczyk et al. ......... 606/41 |
| 7,236,816 B2 | * | 6/2007 | Kumar et al. ................ 600/411 |

FOREIGN PATENT DOCUMENTS

GB 2 350 682 6/1999

* cited by examiner

*Primary Examiner*—Brij B. Shrivastav
(74) *Attorney, Agent, or Firm*—Schiff Hardin LLP

(57) ABSTRACT

A volume coil for a magnetic resonance (MR) tomography apparatus has a number of array coils or coil parts arranged on at least one coil carrier. The coil carrier annularly encloses or the coil carriers annularly encloses or enclose a cross-sectional area that can be varied by modifying the position of the coil carriers or parts thereof relative to one another.

7 Claims, 1 Drawing Sheet

VOLUME COIL FOR A MAGNETIC RESONANCE TOMOGRAPHY APPARATUS

BACKGROUND OF THE INVENTION

1. Field of the Invention

The present invention concerns a radio-frequency volume coil for (MR) tomography apparatus.

2. Description of the Prior Art

A volume coil for MR tomography systems is known from DE 195 09 731 A1. Such volume coils are used in the gradient system of an MR scanner as RF transmission and/or reception coils. Radio-frequency fields for the excitation of the spins are generated and the generated signal is received. If the volume coil operates exclusively or also as a reception coil, its size (i.e. the size of the volume that the volume coil encloses) in relation to the size of the measurement subject plays a determining role for the resulting signal/noise ratio. An optimal signal/noise ratio is achieved when the volume coil is situated optimally close to the contour of the measurement subject.

For this reason it is known in the prior art to implement examinations on the head of a patient with a special head volume coil arrangement. The coil diameter is correspondingly smaller than the diameter of the volume coil with which measurements are conducted on the torso of the patient. In this technique it furthermore remains disadvantageous that these volume coils each has a fixed size. The dimensions of such a coil always are only a compromise since the subjects to be examined (here, for example, the heads of patients) have different sizes.

In head examinations three rough classifications can be made:

(1) the subject has a small head,
(2) the subject has a large head, and
(3) the subject has a head fitted with a stereotaxic frame.

In the latter case the internal volume of the coil must be so large that the stereotaxic frame still has space, which leads to the situation that measurements conducted in such a volume coil system on small or even large heads lead to signals with a reduced signal/noise ratio. In reverse, if one makes the coil volume so small that good results are achieved given small or large heads, these volume coil arrangements are not suitable for measurements with a stereotaxic frame.

DE 195 09 371 A1 describes a modifiable antenna for a magnetic resonance apparatus with an antenna conductor that can be adapted to examination areas of varying size. This ensues in that a region of the antenna conductor is divided into individual conductor pieces whose ends can be connected with one another via loop contacts. A conductor piece is surrounded by a housing which is fashioned as a sheath or jacket. The conductor piece has loop tracks arranged on an inside of the sheath and belonging to the loop contact, such that a loop accepter on a further conductor piece can be inserted into the sheath and can be brought into contact with the loop contact at various positions.

In this antenna arrangement, the loop contacts are located at a point that is not visible, such that neither the electrical connection nor the mechanical contact can be checked.

SUMMARY OF THE INVENTION

An object of the present invention is to avoid the aforementioned disadvantages of the prior art and to provide a volume coil of variable size with which measurements of heads of different sizes as well as measurements of heads with stereotaxic frames can be conducted. The invention is not limited to volume coils that are used in the head region of a patient, since volume coils with variable internal cross-section can be advantageously used everywhere that a better signal/noise ratio can be achieved by an adaptation of the cross-section of the volume coil to the contours of the measurement subject.

The above object is achieved in accordance with the present invention by a volume coil for use in a magnetic resonance tomography apparatus having a number of array coils or coil parts (i.e., RF resonators) arranged on two coil carriers that, in combination, annularly enclose a cross-sectional area that can be varied by changing the position of one of the coil carriers relative to the other. One of the two coil carriers is rigid, and forms a lower part of the annular ring, and the other of the two coil carriers is deformable, and forms the upper part of the ring. The rigid coil carrier has a carrier insert on the side thereof forming the interior of the annular ring. This carrier insert is shorter than the overall length of this coil carrier, and thus the coil carrier has opposite ends that each extend beyond the carrier insert. At least one end of the deformable coil carrier can be displaced radially inwardly passed the adjacent end of the rigid coil carrier, until that end of the deformable coil carrier abuts the carrier insert. Additionally, this at least one end of the deformable coil carrier can also be displaced radially inwardly passed the adjacent end of the carrier insert.

DESCRIPTION OF THE PREFERRED EMBODIMENTS

Figure 1:
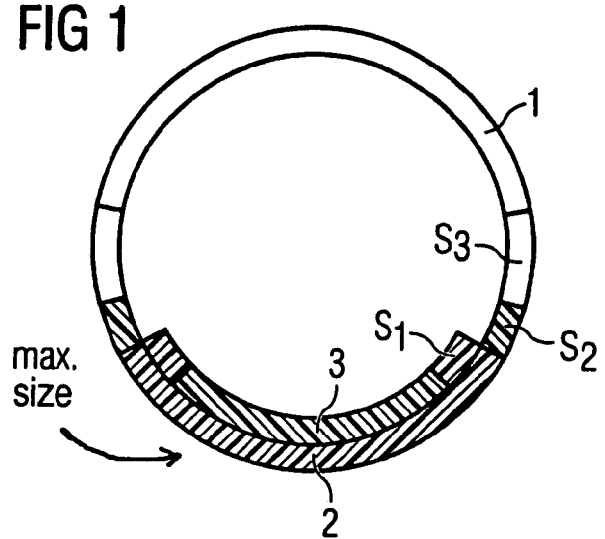
FIG. 1 shows an exemplary embodiment of an inventive volume coil in a state with maximum cross-sectional area.

The volume coil shown in FIG. 1 has two coil carriers 1, 2 that, in the shown case, are each in the shape of circle segments and are arranged with their ends abutting one another. An annular volume coil arrangement is thereby generated. The coil carriers 1, 2 respectively carry array coil elements S1, S2, S3, S4 whose precise circuitry plays a subordinate role in the context of interest here, such that description thereof is not necessary. The lower coil carrier 2 in FIG. 1 additionally has a further carrier insert element 3 on its inner side (i.e. directed toward the center point of the ring). The carrier insert 3 describes a shorter circle segment than the length of the circle segment of the lower coil carrier 2. The inner carrier insert 3 likewise has array coil elements S1. It can be seen in FIG. 1 that the coil carrier 2 on both sides projects (by the width of the array coil element S2) beyond the front ends of the carrier inset 3. The coil elements S1, S2, S3 and S4 can themselves in turn be formed by multiple elements.

Figure 2:
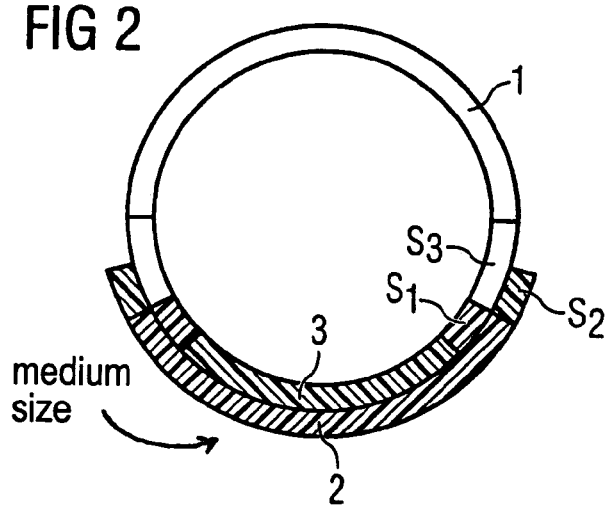
FIG. 2 shows the volume coil according to FIG. 1 in modified a configuration with a medium cross-sectional area.

The upper coil carrier 1 can be deformed, for example by being flexibly formed from corresponding material (for example plastic) or can be provided with articulations (not shown in FIG. 1) with which its deformation is achieved. The upper coil carrier 1 can be detached from the lower coil carrier 2 and its free ends thereby arising can be fed to one another insofar as they can be displaced past the ends of the lower coil carrier along its inner surfaces until they abut against the ends of the carrier insert 3 (as shown in FIG. 2). The circumference of the volume coil has been reduced in this manner, and its cross-sectional area or the volume is also reduced.

In other words, this means that if, for example, a head of a patient lies in the volume coil, for which head the configuration of the inventive volume coil shown in FIG. 1 offers too large a cross-sectional area, this cross-sectional area can be reduced via the measure describe above, meaning that it can be adapted to the head size of the patient. As already explained, the signal/noise ratio of the reception coils is thereby distinctly improved. As can be seen in FIG. 2, in this arrangement the array coil elements S2 and S3 lie atop one another viewed in the radial direction. In this case one of the two array coil elements S2 or S3 can be deactivated in order to avoid aliasing (fold over) artifacts in the measurement signals or couplings of the coil elements.

Figure 3:
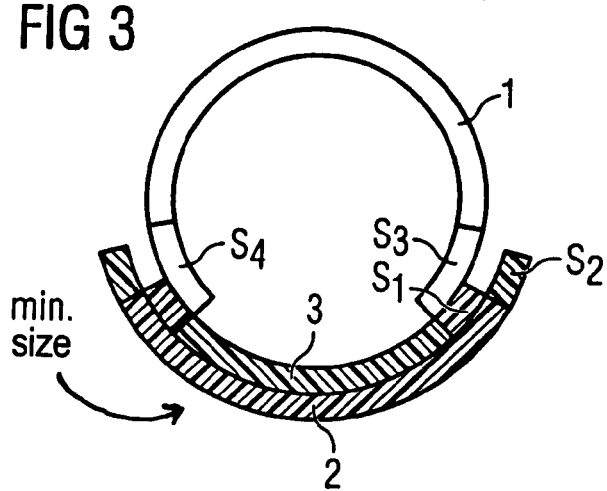
FIG. 3 shows the volume coil according to FIG. 1 in a modified configuration with minimum cross-sectional area.

FIG. 3 shows a further possible reduction of the cross-sectional area by the ends of the deformable upper coil carrier 1 being moved further toward one another, such that the end regions of the upper coil carrier are situated on the inner end surfaces of the carrier insert 3 with a certain overlap. In this case the array coil elements S1 and S3 overlap (at least partially) in the radial direction, so again artifacts can be avoided by deactivation of one of the two array coil elements.

As can be seen from FIGS. 1 through 3, the inventive volume coil with variable size (i.e. variable cross-sectional area) can produce cross-sections respectively adapted for individual examination subjects of different sizes, with which the signal/noise ratio of the reception coils is optimized. Such an adaptation could not be achieved with conventional volume coils of fixed size.

Although modifications and changes may be suggested by those skilled in the art, it is the intention of the inventor to embody within the patent warranted hereon all changes and modifications as reasonably and properly come within the scope of his contribution to the art.

I claim as my invention:

1. A volume coil for emitting or receiving radio frequency energy in a magnetic resonance tomography apparatus, said volume coil comprising:

two coil carriers forming, in combination, an annular ring, one of said two coil carriers being a rigid coil carrier and forming a lower portion of said annular ring, and the other of said two coil carriers being a deformable coil carrier forming an upper portion of the annular ring;

said rigid coil carrier having a carrier insert at a side thereof facing an interior of said annular ring, said rigid coil carrier extending beyond said carrier insert at each of opposite ends of said rigid coil carrier;

at least one end of said deformable coil carrier being displaceably radially inwardly passed an adjacent end of the rigid coil carrier until said at least one end of said deformable coil carrier abuts an adjacent end of said carrier insert, and said at least one end of said deformable coil carrier also being displaceable radially inwardly past said adjacent end of said carrier insert; and a plurality of radio frequency resonators carried by said two coil carriers.

2. A volume coil as claimed in claim 1 wherein each of said two coil carriers respectively carries at least one of said plurality of radio frequency resonators.

3. A volume coil as claimed in claim 1 wherein each of said radio frequency resonators has a resonator width, and wherein said at least one end of said deformable coil carrier is deformable so as to overlap said adjacent end of said rigid coil carrier by an amount corresponding to said resonator width.

4. A volume coil as claimed in claim 1 wherein, if said at least one end of said deformable coil carrier overlaps, in whole or in part, any of said radio frequency resonators, any overlapped radio frequency resonator is deactivated.

5. A volume coil as claimed in claim 1 wherein said radio frequency resonators form a set of radio frequency resonators, and comprising a plurality of different sets of radio frequency resonators of respectively different sizes, and wherein said carrier insert is removable from said rigid coil carrier, and wherein said volume coil comprises a plurality of further carrier inserts respectively corresponding in size to the differently sized radio frequency resonators in the plurality of sets of radio frequency resonators.

6. A volume coil as claimed in claim 1 wherein said deformable coil carrier is comprised of flexible plastic.

7. A volume coil as claimed in claim 1 wherein said deformable coil carrier comprises articulations allowing deformation thereof.

* * * * *